(12) United States Patent
Earnshaw

(10) Patent No.: US 11,906,784 B2
(45) Date of Patent: Feb. 20, 2024

(54) TURNABLE FREE SPACE OPTICAL FILTERS

(71) Applicant: Nokia Solutions and Networks Oy, Espoo (FI)

(72) Inventor: Mark Earnshaw, Berkeley Heights, NJ (US)

(73) Assignee: Nokia Solutions and Networks Oy, Espoo (FI)

(*) Notice: Subject to any disclaimer, the term of this patent is extended or adjusted under 35 U.S.C. 154(b) by 0 days.

(21) Appl. No.: 17/717,537

(22) Filed: Apr. 11, 2022

(65) Prior Publication Data

US 2023/0324617 A1 Oct. 12, 2023

(51) Int. Cl.
*G02B 6/293* (2006.01)
*G02B 6/12* (2006.01)

(52) U.S. Cl.
CPC ..... *G02B 6/29395* (2013.01); *G02B 6/12007* (2013.01); *G02B 6/29361* (2013.01); *G02B 6/29398* (2013.01)

(58) Field of Classification Search
CPC ............. H01S 5/02325; H01S 5/02251; H01S 5/0687; H01S 5/141; G02B 6/12007; G02B 6/29395; G02B 6/29361; G02B 6/29398; G02B 6/36; G02B 6/3616; G02B 6/3648; G02B 6/3652; G02B 6/3656
See application file for complete search history.

(56) References Cited

U.S. PATENT DOCUMENTS

| | | | |
|---|---|---|---|
| 5,408,319 A | 4/1995 | Halbout et al. | |
| 7,295,582 B2* | 11/2007 | McDonald | H01S 5/02446 372/28 |
| 7,961,374 B2 | 6/2011 | Finot et al. | |
| 2003/0025976 A1* | 2/2003 | Wipiejewski | G02F 1/0147 359/240 |
| 2003/0048970 A1 | 3/2003 | Cole et al. | |
| 2007/0002926 A1 | 1/2007 | McDonald et al. | |
| 2010/0247022 A1 | 9/2010 | Li et al. | |
| 2012/0219023 A1 | 8/2012 | Cahill et al. | |
| 2013/0336613 A1 | 12/2013 | Meade et al. | |
| 2019/0155066 A1 | 5/2019 | Zhang et al. | |
| 2020/0052789 A1 | 2/2020 | Kim | |
| 2020/0280173 A1 | 9/2020 | Gao et al. | |

OTHER PUBLICATIONS

Li, et al.; "A Thermal Tunable Bulk-Micromachined Optical Filter"; Transducer'11, Beijing, China; Jun. 5-9, 2011; M3P.134; 4 pgs.
(Continued)

*Primary Examiner* — Omar R Rojas

(57) ABSTRACT

An optical apparatus, comprising a semiconductor substrate, a dielectric layer located on the semiconductor substrate, wherein a membrane portion of the dielectric layer is located over a cavity in a surface of the semiconductor substrate, a resistive heater located on the membrane portion, the resistive heater being controllable by a current applied to the resistive heater and an etalon optical filter located on the resistive heater and over the cavity, an optical passband of the etalon optical filter being wavelength tunable by the resistive heater. A method of manufacturing the optical apparatus is also disclosed.

20 Claims, 11 Drawing Sheets

(56) References Cited

OTHER PUBLICATIONS

Frenkel, et al.; "Angle-Tuned Etalon Filters for Optical Channel Selection in High Density Wavelength Division Multiplexed Systems"; Journal of Lightwave Technology, vol. 7, No. 4; Apr. 1989; 10 pgs.

Hohlfeld, et al.; "Thermal and Optical Characterization of Silicon-Based Tunable Optical Thin-Film Filters"; Journal of Microelectromechanical Systems, vol. 16, No. 3; Jun. 2007; 11 pgs.

Domash, et al.; "Tunable and Switchable Multiple-Cavity Thin Film Filters"; Journal of Lightwave Technology, vol. 22, No. 1; Jan. 2004; 10 pgs.

Murano, et al.; "Tunable GPON Receivers Enable Phased Migration to 1Gb/s per Subscriber"; NME4.pdf; Conference on Optical Fiber Communication; 2009; 3 pgs.

Earnshaw, et al.; "Ultra-low power thermo-optic silica-onsilicon waveguide membrane switch"; Electronic Letters, Mar. 29, 2007, vol. 43, No. 7; 2 pgs.

Finot, et al.; "Automated Optical Packaging Technology for 10 GB/s Transceivers and its Application to a Low-Cost Full C-Band Tunable Transmitter"; Intel Technology Journal, vol. 8, Issue 2; May 10, 2004; 16 pgs.

Finot, et al.; "Thermally Tuned External Cavity Laser With Micromachined Silicon Etalons: Design, Process and Reliability"; 2004 Electronic Components and Technology Conference; 6 pgs.

Frey, et al.; "Temperature-dependent refractive index of silicon and germanium"; Society of Photo-Optical Instrumentation Engineers (SPIE); 2006; 10 pgs.

Gao, et al.; "Hybrid Integration With Efficient Ball Lens-Based Optical Coupling for Compact WDM Transmitters"; IEEE Photonics Technology Letters, vol. 28, No. 22, Nov. 15, 2016; 4 pgs.

Gao, et al.; High-Power, Narrow-Linewidth, Miniaturized Silicon Photonic Tunable Laser with Accurate Frequency Control; Journal of Lightwave Technology; 2019 IEEE; 7 pgs.

Gates, et al.; "Hybrid Integrated Silicon Optical Bench Planar Lightguide Circuits"; 1998 Electronic Components and Technology Conference; 9 pgs.

Grillanda, et al.; "16 Wavelengths Comb Source Using Large-Scale Hybrid Photonic Integration"; OFC 2022 © Optica Publishing Group 2022; 3 pgs.

Guan, et al.; "Widely-tunable, narrow-linewidth III-V/silicon hybrid external-cavity laser for coherent communication"; Optical Society of America, 2018; 12 pgs.

Hammond, et al.; integrated Wavelength Locker for Tunable Laser Applications; 2022 IEEE; 2 pgs.

Hohfeld, et al.; "A thermally tunable, silicon-based optical filter"; Sensors and Actuators A 103 (2003) 93-99; 2003 Elsevier Science B.V.; 7 pgs.

Kita, et al.; "Narrow Spectral Linewidth Silicon Photonic Wavelength Tunable Laser Diode for Digital Coherent Communication System"; IEEE Journal of Selected Topics in Quantum Electronics; vol. 22, No. 6; Nov./Dec. 2016; 12 pgs.

Kobayashi, et al.; "Silicon Photonic Hybrid Ring-Filter External Cavity Wavelength Tunable Lasers"; Journal of Lightwave Technology; vol. 33, No. 6; Mar. 15, 2015; 6 pgs.

Li, et al.; "Silicon micro-ring tunable laser for coherent optical communication"; 2016 Optical Society of America; Optics Express; vol. 24, No. 6; Mar. 21, 2016; 9 pgs.

Osenbach, et al.; "Low Cost/High Volume Laser Modules Using Silicon Optical Bench Technology"; 1998 Electronic Components and Technology Conference; 7 pgs.

Pinguet, et al.; "High-Volume Manufacturing Platform for Silicon Photonics"; Proceedings of the IEEE; vol. 106, No. 12; Dec. 2018; 10 pgs.

Sarlet, et al.; "Control of Widely Tunable SSG-DBR Lasers for Dense Wavelength Division Multiplexing"; Journal of Lightwave Technology; vol. 18, No. 8; Aug. 2000; 11 pgs.

Sato, et al.; "High Output Power and Narrow Linewidth Silicon Photonic Hybrid Ring-Filter External Cavity Wavelength Tunable Lasers"; ECOC 2014, Cannes - France PD.2.3; 3 pgs.

Sugita, et al.; "Bridge-suspended silica-waveguide thermo-optic phase shifter and its application to Mach-Zehnder type optical switch"; The Transactions of the IEICE; vol. E 73, No. 1; Jan. 1990; 4 pgs.

Tuominen, et al.; "Wavelength reference for optical telecommunications based on a temperature-tunable silicon etalon"; Review of Scientific Instruments; vol. 74, No. 8; Aug. 2003; 4 pgs.

Verdier, et al.; "Wideband material for Low linewidth Widely Tunable Laser and Reach Extender for Optical Access Networks"; 2017 European Conference on Optical Communication (ECOC); Sep. 17-21, 2017; 3 pgs.

Verdier, et al.; "Ultrawideband Wavelength-Tunable Hybrid External-Cavity Lasers"; Journal of Lightwave Technology; vol. 36, No. 1; Jan. 1, 2018; 7 pgs.

Liu, et al.; "Wide Tunable Double Ring Resonator Coupled"; IEEE Photonics Technology Letters; vol. 14, No. 5; May 2002; 3 pgs.

* cited by examiner

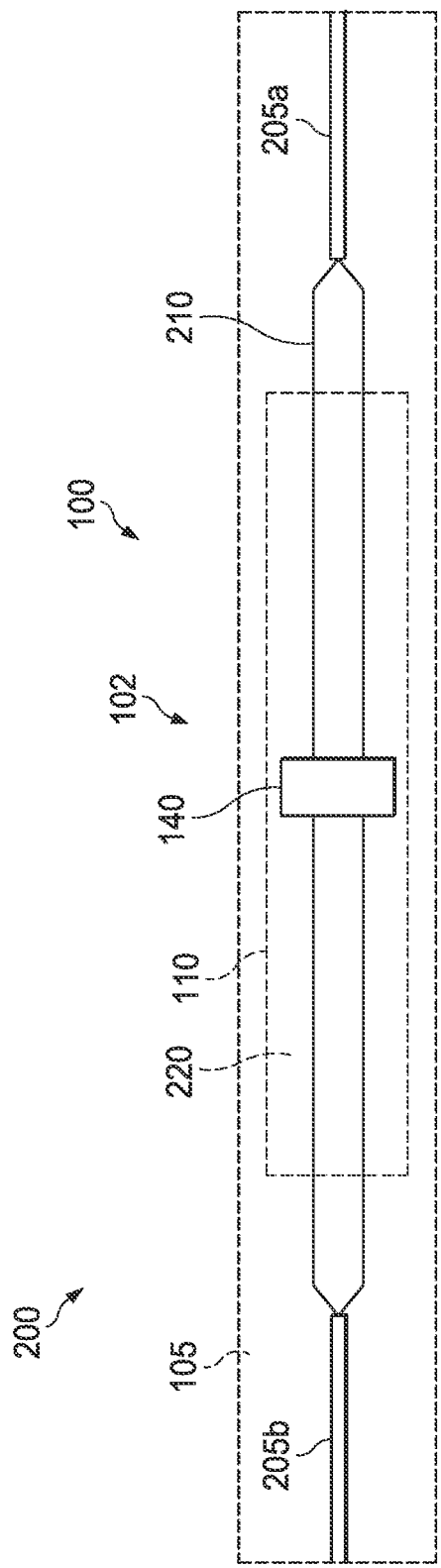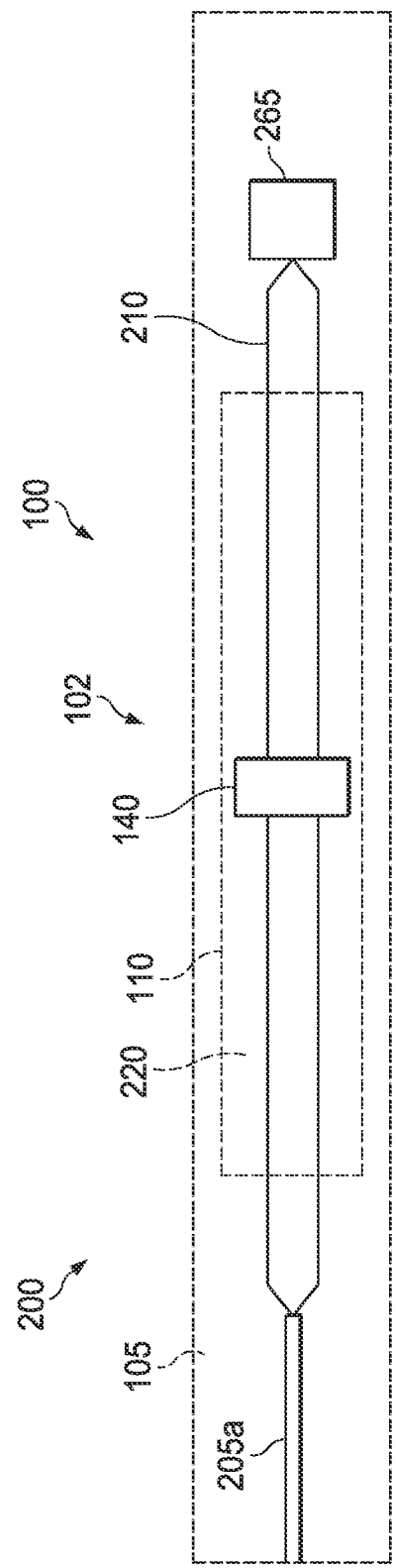

TURNABLE FREE SPACE OPTICAL FILTERS

TECHNICAL FIELD

This application is directed, in general, to optical communications apparatuses and in particular, planar optical assemblies and their manufacture.

BACKGROUND

This section introduces aspects that may help facilitate a better understanding of the inventions. Accordingly, the statements of this section are to be read in this light and are not to be understood as admissions about what is prior art or what is not prior art.

Tunable filters are important components of wavelength tunable optical apparatuses such as wavelength-division multiplexing (WDM) receivers, optical system monitors and tunable lasers.

Tunable filters are often tuned by angular rotation, carrier injection or thermal means. Mechanical angle tuning can require large electrostatic or electromagnetic motor arrangements. Carrier injection can introduce absorption losses together with refractive index tuning. Thermal tuning can be subject to tuning crosstalk from unintended thermal variations from the environment or other co-integrated components that are dissipating varying heat loads over time.

SUMMARY

One embodiment is an optical apparatus, comprising a semiconductor substrate, a dielectric layer located on the semiconductor substrate, where a membrane portion of the dielectric layer is located over a cavity in a surface of the semiconductor substrate, and a resistive heater located on the membrane portion, the resistive heater being controllable by a current applied to the resistive heater. An etalon optical filter of the apparatus is located on the resistive heater and over the cavity, an optical passband of the etalon optical filter being wavelength tunable by the resistive heater.

Some embodiments of the etalon optical filter can include a silicon slab being upright on the dielectric layer.

Any such embodiments of the apparatus can further include another etalon optical filter located on another membrane portion of the dielectric layer over another cavity in the surface of the semiconductor substrate, and another resistive heater located below the another etalon filter and on the another portion of the dielectric layer. The another resistive heater can be controllable by applying a current thereto and the another etalon optical filter can be wavelength tunable by the another resistive heater.

In some embodiments the dielectric layer can be a silica layer and the semiconductor substrate can be a silicon substrate. In some such embodiments, the semiconductor substrate can be a silicon optical bench substrate.

In any such embodiments of the apparatus an area footprint of the resistive heater on the membrane portion can be within an area footprint of the etalon optical filter on the membrane portion.

In some embodiments of the apparatus the resistive heater can be electrically connected to a metal filled via passing through the dielectric layer.

In some embodiments of the apparatus, the etalon optical filter can be coated with a partially reflective dielectric material layer.

In some embodiments of the apparatus, the cavity can have an undercut portion with an undercut length below the membrane portion that can be a value in a range from 50 to 120 microns, and a maximal cavity depth below the membrane portion that can be in a range from 80 to 240 microns.

Any such embodiments of the apparatus can include a thermally tunable optical filter that is part of a planar optical assembly that further includes a portion of an optical fiber positioned on semiconductor substrate to transmit a light of different selected wavelengths through the etalon optical filter. In some such embodiments, the optical fiber can be located to transmit the light via the etalon optical filter to a photodetector located on the semiconductor substrate.

In any such embodiments, the planar optical assembly can further include a tunable optical phase shifter chip physically located on a different one of the resistive heater layer and located between a first one of the etalon optical filter and a second one of the etalon optical filter, wherein the phase chip is thermally tunable by applying another current through the different one of the resistive layer.

In any such embodiments, the planar optical assembly can further include a reflective semiconductor optical amplifier gain chip located on the semiconductor substrate and optically located between the optical fiber and the thermally tuned optical filter.

In any such embodiments, the planar optical assembly can further include a lens located on the semiconductor substrate and between the photodetector and the thermally tunable optical filter.

In any such embodiments, the planar optical assembly can further include a lens located on the semiconductor substrate and between the optical fiber and a partial mirror or isolator located on the semiconductor substrate.

In any such embodiments, the planar optical assembly can be a wavelength-tunable optical receiver for a Wavelength Division Multiplexing Passive Optical Network.

Another embodiment is method of manufacturing an optical apparatus. The method can include forming a thermally tuned optical filter, which can include providing a semiconductor substrate, depositing a dielectric layer on the semiconductor substrate and forming a cavity in the semiconductor substrate wherein a membrane portion of the dielectric layer is located over the cavity in the semiconductor substrate. The method can include forming a resistive heater layer on the membrane portion and forming an electrode layer connected to the resistive layer such that a temperature of the resistive layer is controllable by a current applied from the electrode layer to the resistive layer. The method can include positioning an etalon optical filter on the resistive layer and over the cavity, where an optical passband through the etalon optical filter is tunable by changing a refractive index of the etalon optical filter from the temperature change of the resistive layer.

In any embodiments of the method, the forming of the cavity can include, after forming the resistive layer and after forming the electrode layer, forming one or more openings in the dielectric layer and then etching the semiconductor substrate through the one or more openings.

In any embodiments of the method, the forming of the resistive layer and the forming of the electrode layer can include, after forming the cavity, sputter depositing a nickel-chromium layer on the dielectric layer and then patterning the nickel-chromium layer to form the resistive layer and the electrode layer connected to the resistive layer.

BRIEF DESCRIPTION OF THE DRAWINGS

The embodiments of the disclosure are best understood from the following detailed description, when read with the accompanying FIGURES. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which:

FIG. 3A presents another example embodiment of the optical apparatus similar to the view shown in FIG. 2B;

FIG. 3B presents another example embodiment of the optical apparatus similar to the view shown in FIG. 3A;

In the Figures and text, similar or like reference symbols indicate elements with similar or the same functions and/or structures.

In the Figures, the relative dimensions of some features may be exaggerated to more clearly illustrate one or more of the structures or features therein.

Herein, various embodiments are described more fully by the Figures and the Detailed Description. Nevertheless, the inventions may be embodied in various forms and are not limited to the embodiments described in the Figures and Detailed Description of Illustrative Embodiments.

DETAILED DESCRIPTION

The description and drawings merely illustrate the principles of the inventions. It will thus be appreciated that those skilled in the art will be able to devise various arrangements that, although not explicitly described or shown herein, embody the principles of the inventions and are included within its scope. Furthermore, all examples recited herein are principally intended expressly to be for pedagogical purposes to aid the reader in understanding the principles of the inventions and concepts contributed by the inventor(s) to furthering the art, and are to be construed as being without limitation to such specifically recited examples and conditions. Moreover, all statements herein reciting principles, aspects, and embodiments of the inventions, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

Embodiments of the invention are driven by the desire to increase levels of integration for optical assemblies expected to have increasing thermal densities and gradients. The invention embodiments provide an optical assembly with improved thermal isolation of etalon optical filters. The assembly integrates a thermal isolation layer so that the optical filters are located on the layer and over a free space cavity in the substrate of the assembly. Other assembly components (e.g., detectors and gain chips) can thereby be thermally tuned while simultaneously being thermally isolated from power dissipating components on the same substrate.

As demonstrated herein these features also facilitate the manufacture of optical apparatus embodiments, such as optical assemblies, with reduced thermal crosstalk effects during tuning and consequently there is reduced complexity for adjusting filter and phase controls. Such adjustability can be over substantial parts of a laser power curve, with the lasing frequency unaffected by the large changes in a reflective semiconductor optical amplifier gain chip (RSOA) bias power.

Figure 1A:
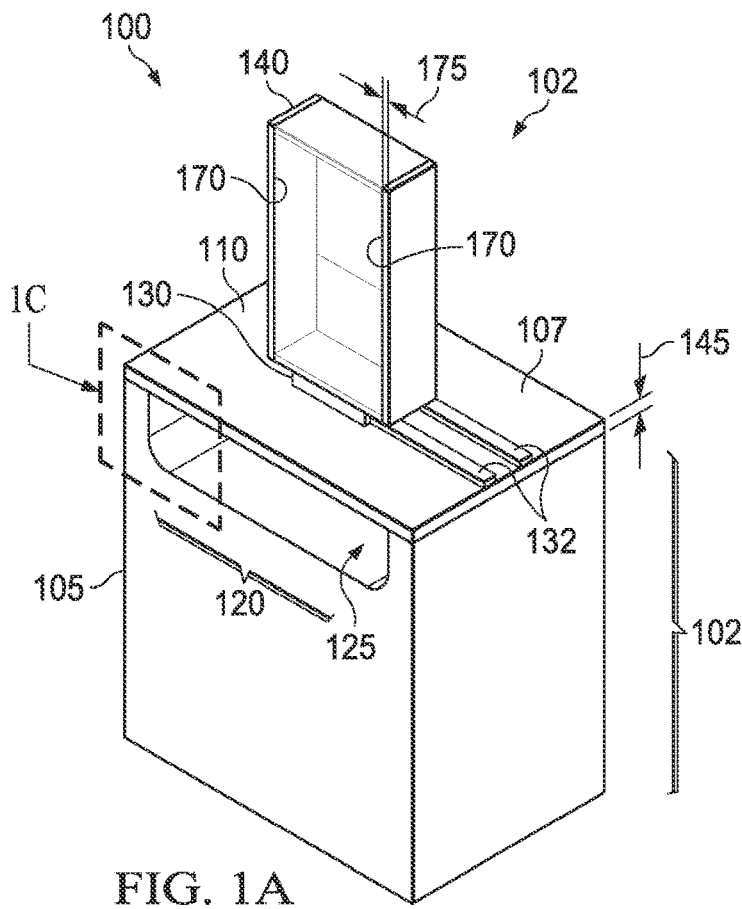
FIG. 1A presents a perspective view of an example embodiment of an optical apparatus of the disclosure.
Figure 1C:
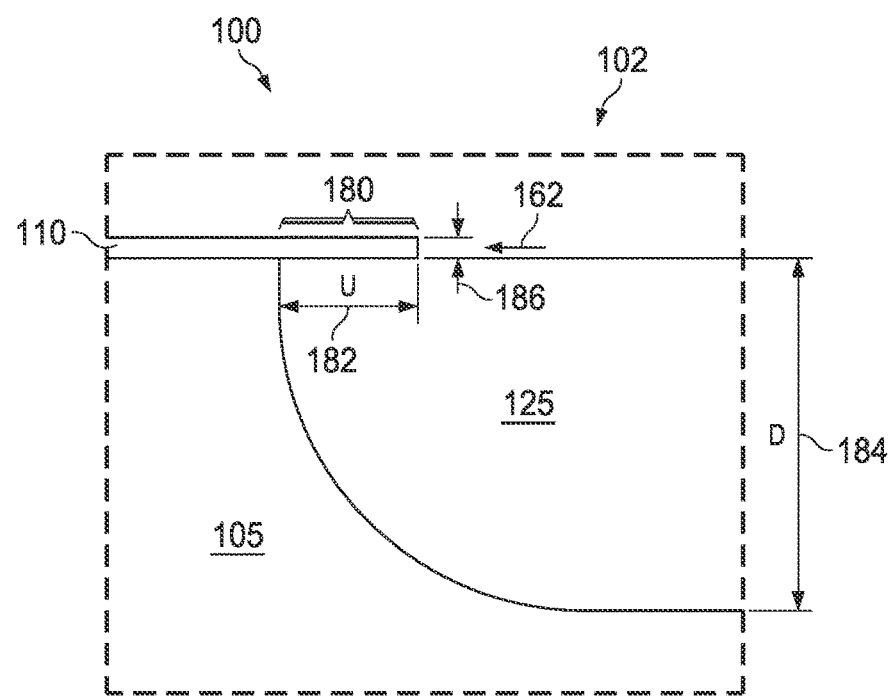
FIG. 1C presents a detailed side view of a portion of the apparatus depicted in FIG. 1B.
Figure 1B:
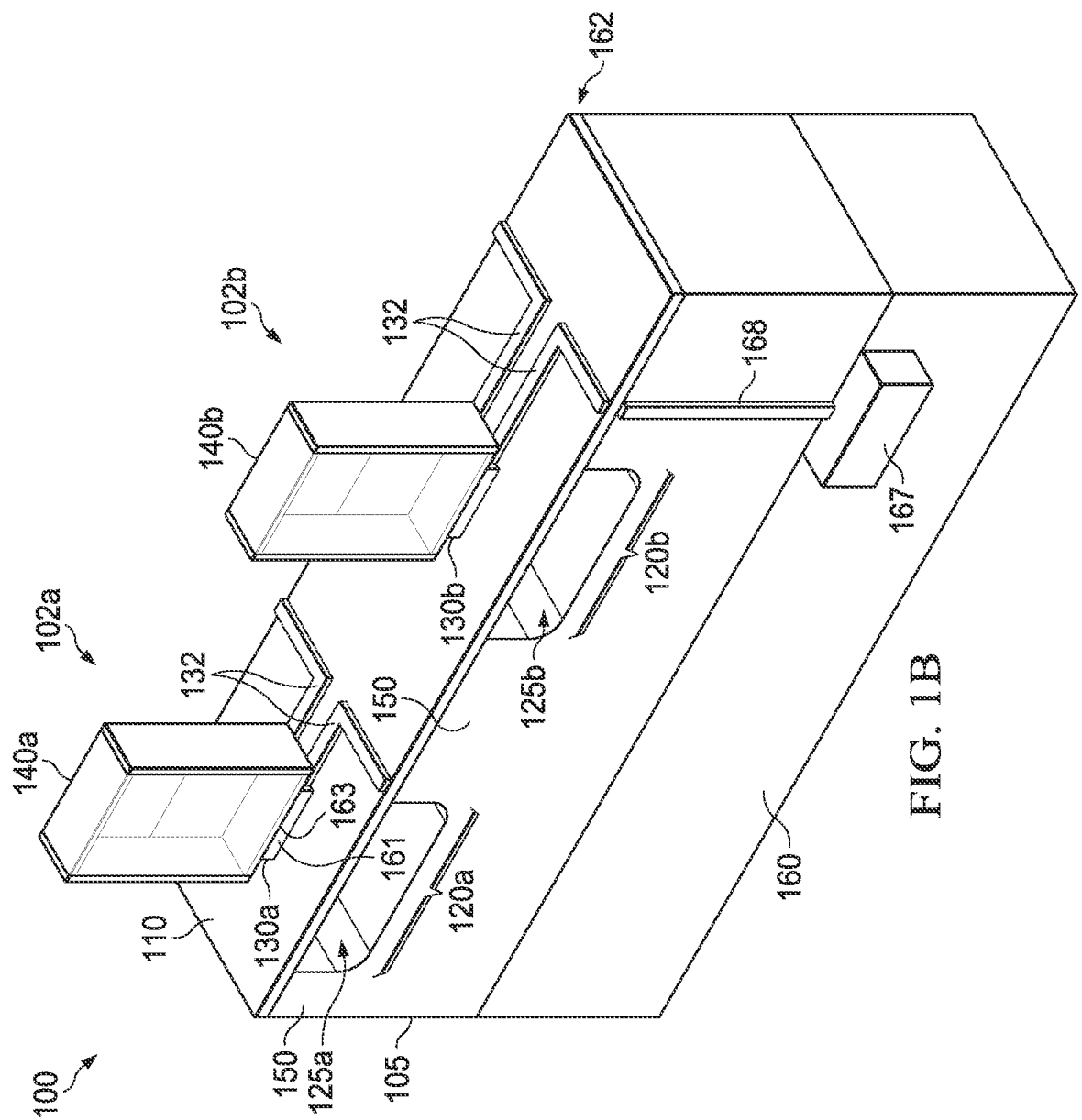
FIG. 1B presents a perspective view of another example embodiment of an optical apparatus of the disclosure.
Figure 1D:
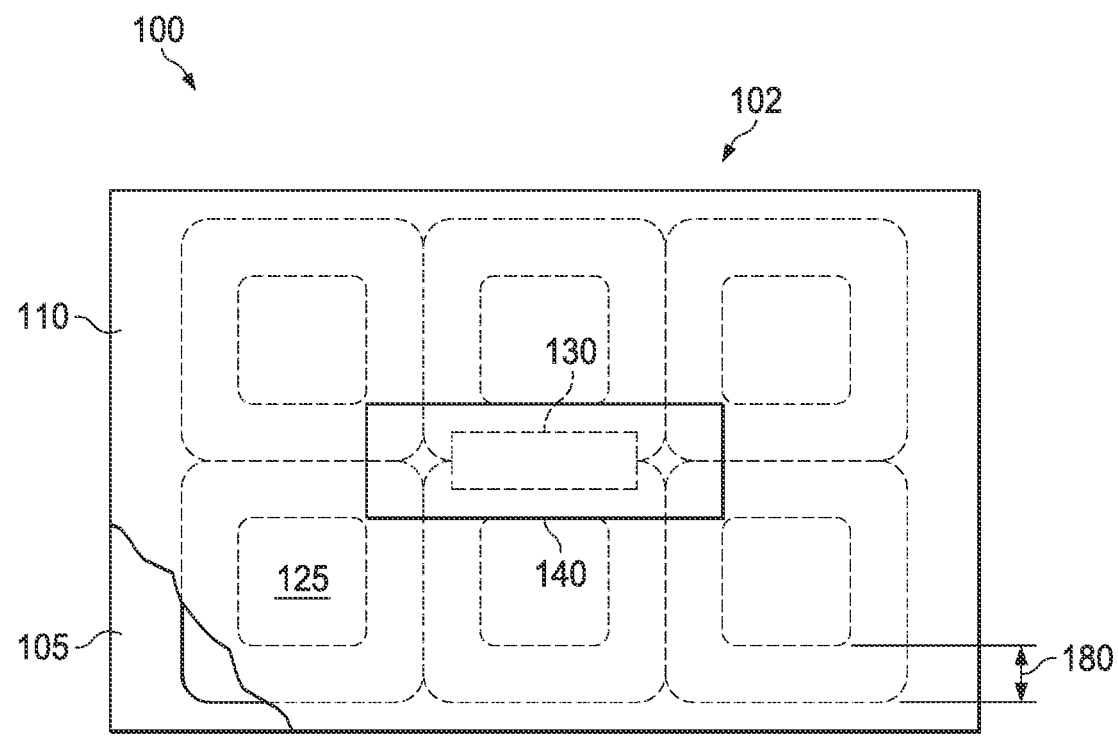
FIG. 1D presents a top down view of another example embodiment of an optical apparatus of the disclosure, similar to the optical apparatuses depicted in FIGS. 1A-1C.

One embodiment of the disclosure is an optical apparatus. FIGS. 1A and 1B presents a perspective view of an example embodiments of an optical apparatus 100 of the disclosure and FIG. 1C presents a detailed side view of a portion of the apparatus depicted in FIG. 1B. FIG. 1D presents a top down view of another example embodiment of an optical apparatus of the disclosure, similar to the optical apparatuses depicted in FIGS. 1A-1C and FIG. 1E presents a side view of the optical apparatus of depicted in FIG. 1D.

Figure 1E:
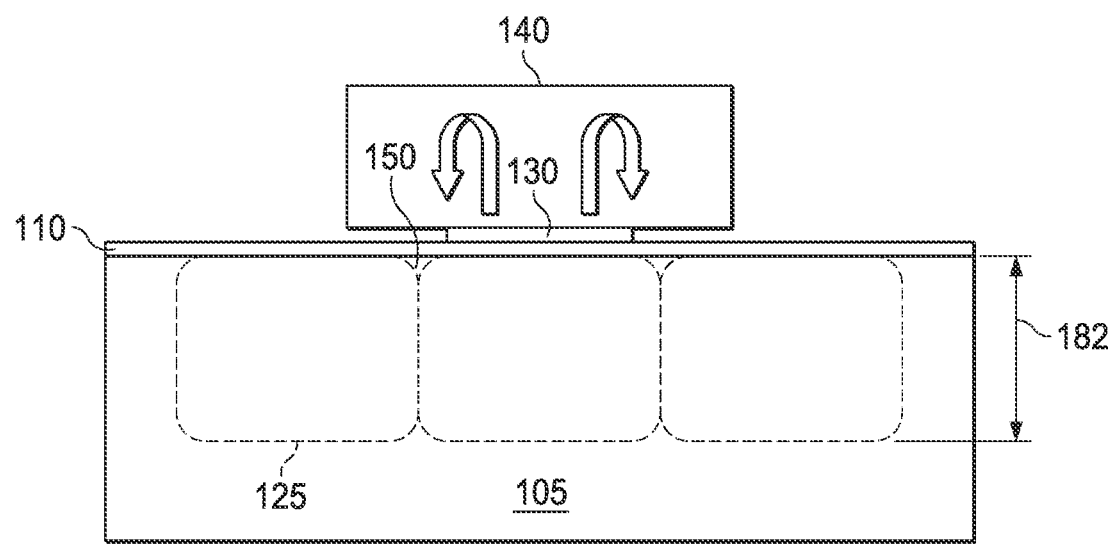
FIG. 1E presents a side view of the optical apparatus of depicted in FIG. 1D.

One embodiment of the disclosure is an optical apparatus. FIGS. 1A and 1B present perspective views of example embodiments of an optical apparatus 100 of the disclosure. FIG. 1C presents a detailed side view of a portion of the apparatus depicted in FIG. 1B. FIG. 1D presents a top down view of another example embodiment of an optical apparatus of the disclosure, i.e., similar to the optical apparatus depicted in FIGS. 1A-1C. FIG. 1E presents a side view of the optical apparatus of depicted in FIG. 1D.

Embodiments of the dielectric layer 110 can be or include a low thermal conductance layer that can be made of silica (e.g., silicon dioxide, thermal conductance equal to about 1.4 W/mK at ° C.), silicon nitride 6 W/mK at 20° C., aerogel (0.03 W/mK at 20° C.) or similar materials familiar to those skilled in the pertinent art, such as materials having a thermal conductivity value in a range from 0.01 to 10 W/m K at 20° C., or an upper thermal conductivity value of less than 20 W/mK at 20° C. in some embodiments.

Embodiments of the semiconductor substrate 105 can be or include a high thermal conductance layer that can be made of silicon (130 W/mK at 20° C.), gallium arsenide (52 W/mK at 20° C.), indium phosphide (68 W/mK at 20° C.) or similar materials familiar to those skilled in the pertinent art, such as materials having a thermal conductivity value in a range from 50 to 150 W/m K at 20° C., or an lower thermal conductivity value of greater than 50 W/mK at 20° C. in some embodiments.

In some embodiments, to facilitate thermal isolation of the etalon optical filter, the dielectric layer 110 (e.g., low thermal conductance layer) has a thermal conductance that is at least 10 (and in some embodiments, at least 20, 40, 60, 80, 100, 500, 1000 or 5000) or times lower than the thermal conductance of the semiconductor high thermal conductance layer.

Some embodiments of the resistive heater 130 can be or include a layer composed of chrome (e.g., chromium, resistivity equal to about 4 e−6 Ω·m at 20° C.), nickel-chromium (1.1 e−6 Ω·m at 20° C.), tantalum nitride (2.0 e−6 Ω·m at 20° C.) or similar materials familiar to those skilled in the pertinent art, such as materials having a resistivity value in a range from 0.5 to 5 e−6 Ω·m at 20° C., or a minimum resistivity value of equal to or greater than 0.2 e−6 Ω·m in some embodiments. In some embodiments, the resistive heater 130 includes a nickel chromium alloy layer.

Some embodiments of the etalon optical filter can be or include high thermal conductance and low optical loss materials such as silicon, gallium arsenide or indium phosphide or similar materials familiar to those skilled in the pertinent art, such as materials providing an upper optical loss value of the etalon of less than 0.2 dB in some embodiments.

Some embodiments of the membrane portion 120 can include or be dielectric low thermal conductance layer having a thickness 145 in a range from 2 to 20 microns (e.g., 12 micron).

As illustrated, embodiments of the etalon optical filter 140 can include a silicon slab being upright on the dielectric layer 110.

Embodiments of the apparatus 100 can include another etalon optical filter 140b located on another membrane portion 120b of the dielectric layer 110 over another cavity 125b in the surface 107 of the semiconductor substrate 105, and another resistive heater 130b located below the another etalon filter 140b and on the another portion 120b of the dielectric layer 110. The other resistive heater 130 can be controllable by applying a current thereto and the other etalon optical filter 140b can be wavelength tunable by the another resistive heater 130b.

For instance, the optical apparatus 100 can include one or more thermally-tuned optical filters 102. For example each thermally-tuned optical filter 102 can include the dielectric low thermal conductance layer 110 located on a semiconductor high thermal conductance layer 105, where a membrane portion 120 of the low thermal conductance layer is located over a cavity 125 in the high thermal conductance layer, the resistive heater 130 located on the membrane portion where a temperature of the resistive layer is controllable by a current applied from an electrode layer 132 connected to the resistive layer and the etalon optical filter 140 located on the resistive layer and over the cavity, where the optical passband through the etalon optical filter is tunable by changing a refractive index of the etalon optical filter from the temperature change of the resistive heater layer.

For instance, to provide enhanced composite optical tuning, the apparatus 100 can include two or more of the thermally tunable optical filters 102, 102b each having two or more of the etalon optical filter 140a, 140b located on different ones of the resistive heater 130a, 130b which are located as layers on different ones of the membrane portions 120a, 120b and which are located over different ones of the cavities 125a, 125b in the semiconductor high thermal conductance layer 110, where the different ones of the cavities are separated by a pillar portions 150 of the semiconductor high thermal conductance layer 105, the pillar portions contacting the dielectric (e.g., low thermal conductance) layer 110.

In some embodiments of the apparatus 100, the dielectric layer 110 is a silica layer and the semiconductor substrate 105 is a silicon substrate. In some such embodiments, the semiconductor substrate 105 is a silicon optical bench substrate.

For instance, for some embodiment, the dielectric layer 110 (e.g., low thermal conductance layer) can include a silica layer and the semiconductor substrate 105 (e.g., high thermal conductance layer) can include a doped and annealed silicon layer located on a wafer substrate 160. In some such embodiments the wafer substrate 160 can be our include a silicon optical bench substrate. In some such embodiments, the wafer substrate (e.g., substrate 160) preferably has a thermal expansion coefficient that is the same or nearly the same (e.g., within 0.01, 0.1, 1, 2, 5 or 10%) as the semiconductor high thermal conductance layer 105.

As illustrated in FIG. 1B in some apparatus embodiments an area footprint 161 of the resistive heater 130a on the membrane portion 120a can be within an area footprint 163 of the etalon optical filter 140a on the membrane portion 120a. For instance, in some embodiments an area footprint 161 of the resistive heater 130, in a plane 162 of the membrane portion 120 is less than and within an area footprint 163 of the etalon optical filter 140. As a non-limiting examples, the area footprint 163 of the etalon optical filter can have a value in a range from 250×250 to 1000×1000 squared microns, and in some embodiments, 300×500 squared microns, and, the area footprint 161 of the resistive layer can have a value in a range from 3×3000 squared microns to 100×100 squared microns and in some embodiments, 30×300 squared microns.

In some embodiments, to provide an alternate means to supply power to the resistive heater (130), a power supply source 167 is electrically connected to a metal filled via 168 passing through the dielectric layer 110. For instance, in some embodiments, the electrode layer 132 can be connected to an electrically conductive metal filled via 168 passing through the dielectric layer 110 and semiconductor substrate 105 to an underlying power source 167 located on a wafer substrate 160.

In any embodiments of the apparatus, the etalon optical filter can be coated with a partially reflective material layer 170. For instance, partially reflective material layer serving as Bragg coating layers 170 of the etalon optical filter 140 can have a thickness 175 in dimension perpendicular to a surface 107 of the dielectric low thermal conductance layer 110, that are equal to about one-quarter wavelength of light (e.g., C and L bands; e.g., 1550 nm) directable through the etalon optical filter.

For instance, a pair of silica and silicon coatings, serving as partially reflective material layers 170, of approximately quarter wave optical thickness at 1550 nm can be coated on both sides of a silicon wafer and the wafer diced to provide one-pair Bragg mirrors with approximately 82% reflectivity per side. One skilled in the art would appreciate how the etalon optical filter's thickness (e.g., a value in a range from 5 to 200 microns for some embodiments) in the optical path direction (e.g., FIG. 2A direction of transmitted light 210) would be decided by the filter's target free spectral range FSR and optical index.

As illustrated in FIG. 1C, some embodiments of the cavity 125 have an undercut portion 180 with an undercut length 182 below the membrane portion 120 that is a value in a range from 50 to 120 microns, and a maximal cavity depth 184 below the membrane portion 120 can be in a range from 80 to 240 microns. In some embodiments, the undercut portion 180 of the dielectric layer 110, and in embodiments, the entire dielectric lay 110, has a thickness 186 that is a value in a range from 5 to 20 microns; e.g., 12 microns in some embodiments. Such undercutting can further help in thermally isolating the etalon from the bulk of the highly thermally conductive semiconductor layer/substrate 150.

Some embodiments of the optical apparatus are part of a planar optical assembly.

Figure 2A:
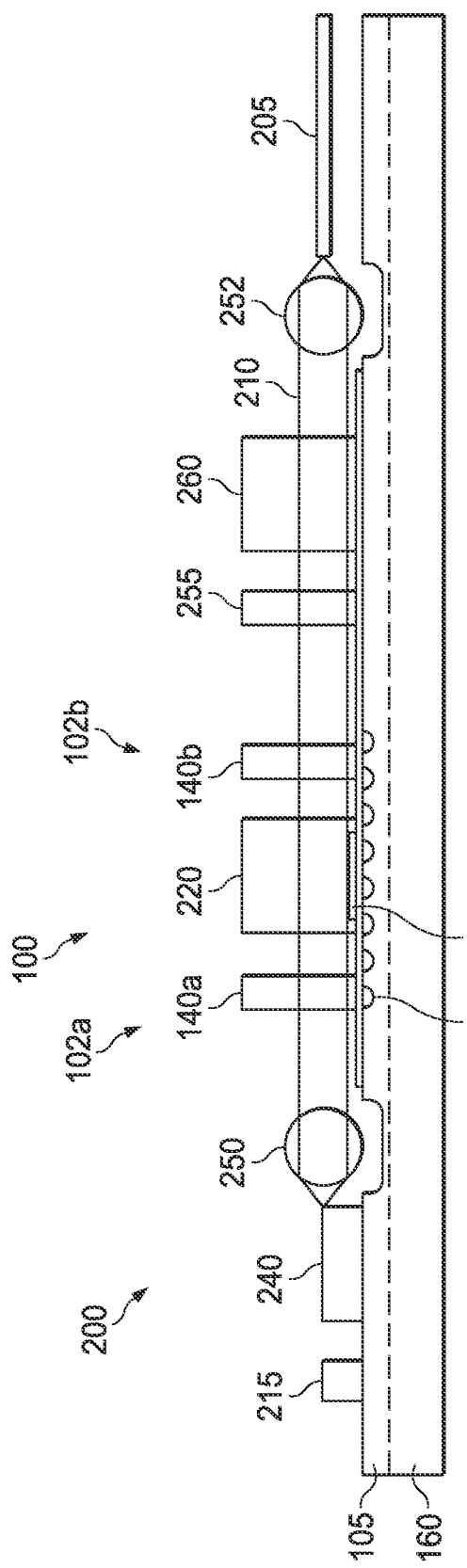
FIG. 2A presents a side view an example planar optical assembly and which can include any embodiments of the apparatus disclosed in the context of FIGS. 1A-1E.
Figure 2B:
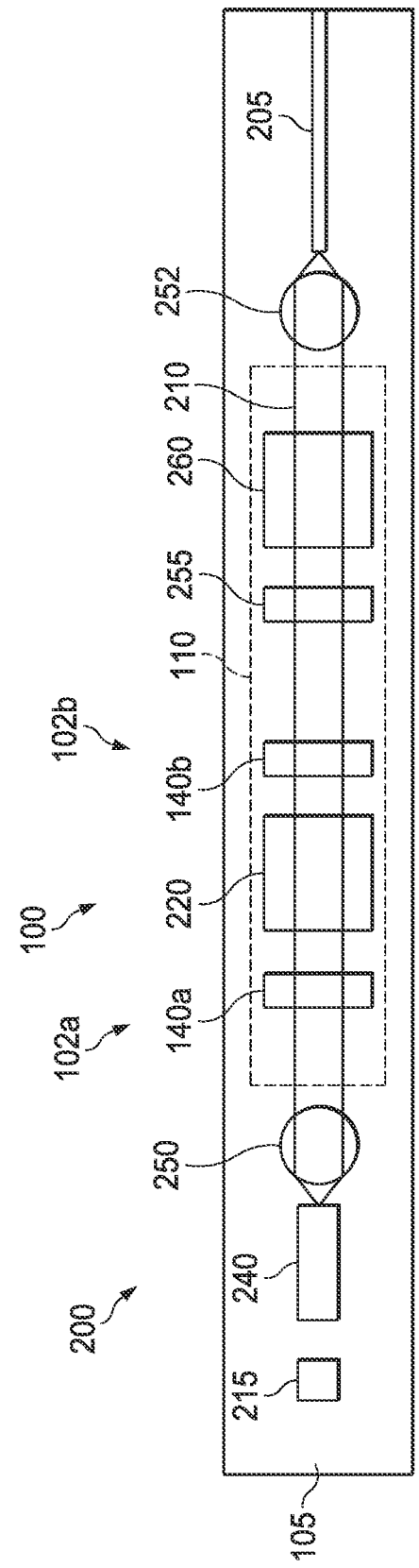
FIG. 2B presents a top down view of the optical apparatus depicted in FIG. 2A.

FIG. 2A presents a side view of an example planar optical assembly 200, which can include any embodiments of the apparatus 100 disclosed in the context of FIGS. 1A-1E. FIG. 2B presents a top down view of the optical apparatus depicted in FIG. 2A. FIG. 3A presents another example embodiment of an optical apparatus similar to that shown in FIG. 2B. FIG. 3B presents another example embodiment of an optical apparatus similar to that shown in FIG. 3A.

With continuing reference to FIGS. 1A-3B throughout, some embodiments of the apparatus 100 include the thermally tunable optical filter 102 that is part of a planar optical assembly 200 (FIGS. 2A and 2B) that can further include a portion of an optical fiber 205 (e.g., a fiber end segment). The thermally tunable optical filter 102 and optical fiber 205 can be positioned on the semiconductor substrate 105 to transmit a light 210 of different selected various wavelengths through the etalon optical filter (e.g., one or more filters 140a, 140b). In some such embodiments, the optical fiber 205 can be located to transmit a portion of the light 210 via the etalon optical filter to a photodetector 215 (e.g., a solid state photon counting detector) located on the semiconductor substrate 195 (e.g., high thermal conductance layer).

In some embodiments, the planar optical assembly 200 can further include a tunable optical phase shifter chip 220 physically located on a different resistive heater 230 and located between a first one of the etalon optical filter 140a and a second one of the etalon optical filter 140b, wherein the chip 220 is thermally tunable by applying another current through the different resistive heater 230

In some embodiments, the planar optical assembly 200 can further include a reflective semiconductor optical amplifier gain chip (RSOA) 240 located on the semiconductor substrate 105 and optically located between the optical fiber 205 and the thermally tunable optical filter 140a.

In some embodiments, the planar optical assembly 200 can further include a lens 250 located on the semiconductor substrate 105 and between the photodetector 215 and the thermally tunable optical filter 102a.

In some embodiments, the planar optical assembly 200 can further include includes a lens 252 located on the semiconductor substrate 105 and between the optical fiber 205 and a partial mirror 255 or isolator 260 located on the semiconductor substrate 105. Some embodiments can further include both such lens 250, 252 located as disclosed above.

In some embodiments, the planar optical assembly 200 can be or include a wavelength-tunable optical receiver for a Wavelength Division Multiplexing Passive Optical Network.

In some embodiments, the planar optical assembly 200 can be or include a standalone tunable receiver further including first optical fiber (e.g., fiber 205a, FIG. 3A) to direct light through the filter 140, such as discloses elsewhere herein, to a second optical fiber (e.g., fiber 205b, FIG. 3A), or, to a detector 265 (e.g., a photodetector FIG. 3B) positioned on the semiconductor substrate 105 to receive the light 210 passing through the etalon optical filter 140.

In some embodiments, the planar optical assembly 200 is a laser whose laser cavity is between the reflector of the RSOA 240 and the partially reflective mirror 255. In such embodiments one or more etalon optical filters 140a, 140b are located to filter light in an optical laser cavity of the laser.

Figure 4:
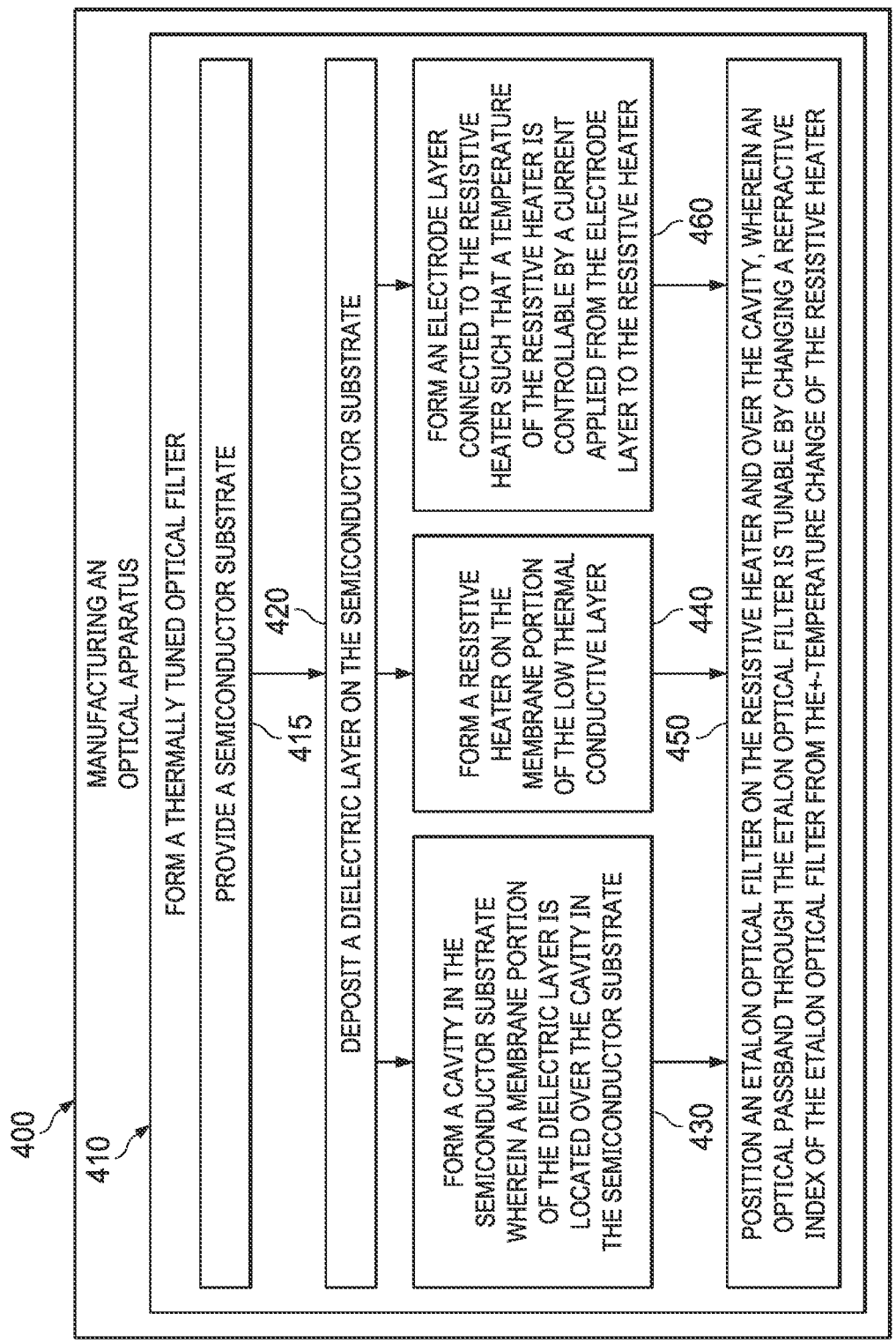
FIG. 4 presents a flow diagram illustrating selected steps in an example method of manufacturing an optical apparatus of the disclosure including any of the apparatus embodiments disclosed in the context of FIGS. 1A-3B.

Another embodiment is a method of manufacturing an optical apparatus. FIG. 4 presents a flow diagram illustrating selected steps in an example method 400 of manufacturing an optical apparatus of the disclosure including any of the apparatus 100 or assembly 200 embodiments disclosed in the context of FIGS. 1A-3B.

With continuing reference to FIGS. 1A-4 throughout, embodiments of the method can include forming (step 410) a thermally tunable optical filter 102. Forming the filter 102 can include providing (e.g., a first step 415) a semiconductor substrate 105 (e.g., any embodiments of the high thermal conductance layer disclosed herein) and depositing (e.g., then step 420) a dielectric layer 110 (e.g., any embodiments of the low thermal conductance layer disclosed herein) on the semiconductor substrate. In some embodiments depositing the dielectric layer (step 420) includes a PECVD process, e.g., depositing layer of PECVD doped silica and then annealing so that dielectric layer is stress matched to the semiconductor substrate.

Forming the thermally tunable optical filter 102 can also include forming a cavity 125 (step 430) in the semiconductor substrate where a membrane portion 120 of the dielectric layer 110 will be located over the cavity in the semiconductor substrate. In some embodiments, forming the cavity (step 430) can include patterning and etching openings in the dielectric layer using anisotropic reactive ion etching (RIE). For instance (e.g., silica glass) anisotropic etching materials can be selected such that etching terminates with high selectivity on the underlying semiconductor substrate. The forming step 430 can include then, isotropically etching the semiconductor substrate 115, e.g., by subjecting the semiconductor substrate to an appropriate isotropic etchant (e.g., $SF_6$) through the previously produced openings in the dielectric layer 110.

Forming the filter 102 can further include forming (step 440) a resistive heater 130 on the membrane portion 125 of the dielectric layer 110 and forming (step 450) an electrode layer 132 connected to the resistive heater 130 such that a temperature of the resistive heater is controllable by a current applied by the electrode layer to the resistive heater.

Forming the filter 102 can further include positioning (step 450) an etalon optical filter 140 to be located on (e.g., directly on) the resistive heater and on the membrane portion of the dielectric layer and over the corresponding cavity, wherein an optical passband through the etalon optical filter is tunable by changing a refractive index of the etalon optical filter from the temperature change due to heat applied thereto with the resistive heater.

In some such embodiments, forming the cavity (step 430) includes, after forming 440 the resistive heater 130 (step 440) and after forming 450 the electrode layer 132, forming one or more openings in the dielectric layer 110 and then etching (e.g., isotropically etching) the semiconductor substrate through the one or more openings.

In some such embodiments, forming the resistive heater (step 440) and the forming of the electrode layer (step 450) can include, after forming the cavity (step 430), sputter depositing a nickel-chromium layer (e.g., resistive heater layer 130) on the dielectric layer 110 and then patterning the nickel-chromium layer to form the resistive layer and the electrode layer connected to the resistive layer. In some embodiments forming the resistive layer can include a lift-off process using evaporation of the NiCr onto prepatterned photoresist.

In some such embodiments, the positioning (step 460) of the etalon optical filter the resistive heater 130 and over the cavity 125 includes a pick and place process wherein the etalon optical filter 140 is positioned (e.g., as a vertical silicon slab) on an adhesive placed on the resistive heater.

Experiments

Test optical apparatus assembly structures were manufactured and tested as further disclosed below.

A silica layer (e.g., silica low thermal conductance dielectric layer 110, "silica") was deposited on a silicon wafer (e.g., silicon semiconductor high thermal conductance layer 105, "wafer") by PECVD to form a doped silica layer which was then thermally annealed so that the layer was stress matched to the silicon wafer. Openings in the silica layer were formed by patterning and etching with etching terminated with high selectivity on the underlying silicon wafer. A metal resistive heating layer (e.g., resistive heater 130, "heater") was deposited using sputtering of nickel-chromium. A thin encapsulation dielectric was deposited and vias were opened to the underlying heater. An electrode layer was then deposited to connect the heater and to provide wiring for a gain chip, thermistor and monitor photodiode. A membrane portion of the silica layer was formed by a reactive ion etching ($SF_6$ RIE) to form a cavity in the underlying portion of the silicon wafer. Ball lens cavities in the silicon wafer were also formed using $SF_6$ RIE.

Figure 5:
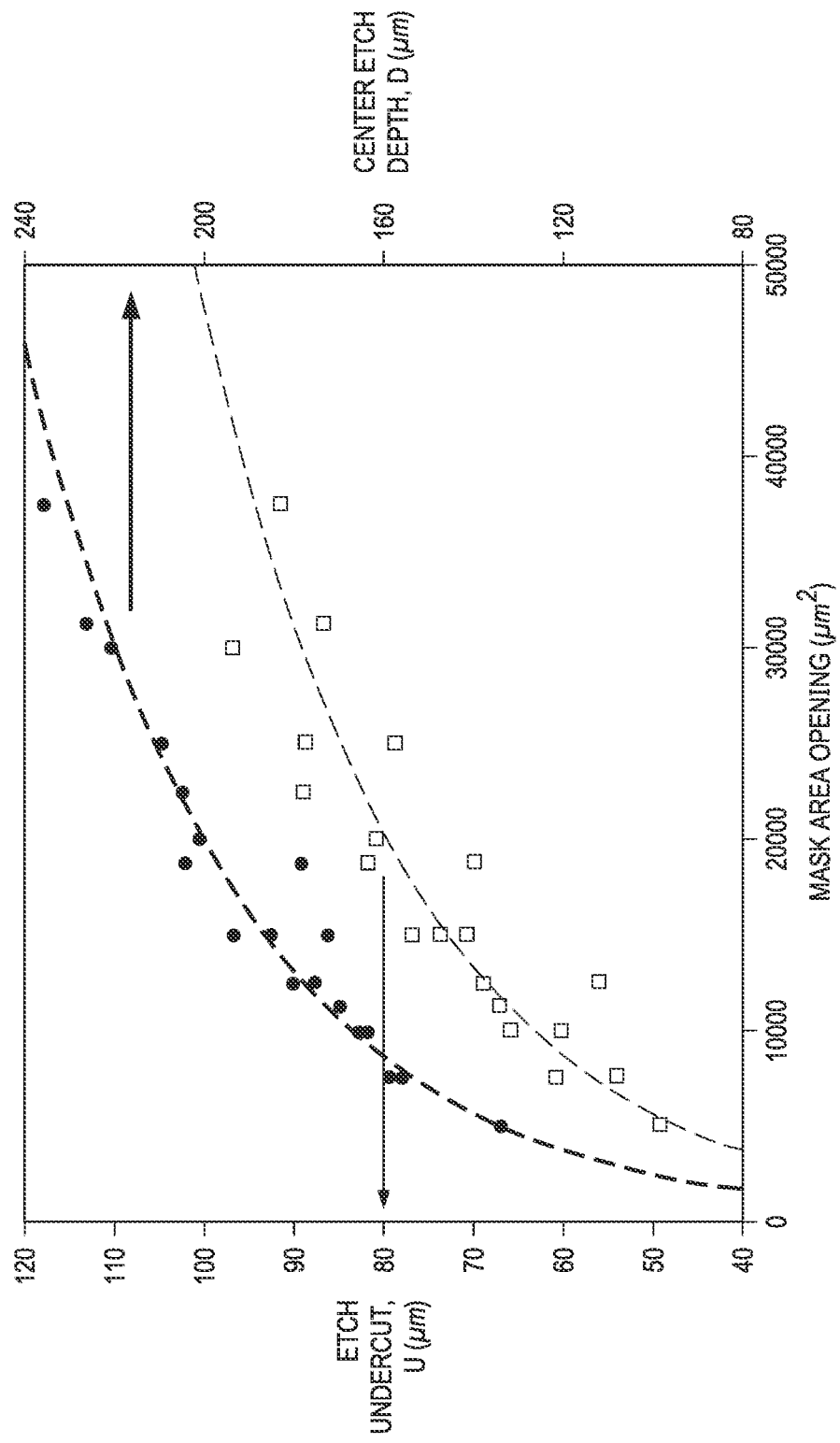
FIG. 5 presents example results for a test apparatus showing the relationship between etch undercut and etch depth of a cavity in a silicon embodiment of the high thermal conductance layer, as a function of a mask area opening in a glass layer embodiment of a silica low thermal conductance layer.

Cross-sections of test etched cavities in test apparatuses, analogous to the cross-section shown in FIG. 1C, were fabricated and quantified. The dimensions of the membrane were determined based on the thickness of the optical etalon filter needed for a robust laser tuning design and the requirements of the pick-and-place equipment used to attach the filters to the membranes after fabrication. As shown in FIG. 5, the silicon under-etch was not fully isotropic, with the etch depth (D) and undercut (U) varying depending on the relative mask opening area due to the dynamics of etchant gas propagation into the cavities. The series of test apparatus structures were fabricated with cavities to identify scaling rules and to ensure robustness to fabrication processes including wafer spinning and dicing. The resulting dependence of D and U based on mask opening area was measured and fitted to facilitate an appropriate design for an efficiently tunable etalon filter with robust mechanical properties.

Informed by the above analysis, test optical assemblies that included embodiments of the optical apparatus were built. The etalon optical filter dimensions was 140 microns thick, 500 microns wide and 300 microns tall. A resistive layer (resistive heater 130) of approximately 10 squares of 36Ω/square NiCr fitting between two silicon pillars was placed 400 microns center-to-center. This design facilitated heat generated in the resistive layer to be directed to travel into the etalon optical filter and then to the edges to reach the silicon pillar path to a thermal ground of the substrate (silicon optical bench substrate, SiOB). Since the silicon etalon optical filter's conductivity was about 100 times larger than the silica low thermal conductance layer and membrane, the filter was uniformly heated with substantially no variations in temperature across the filter sufficient to distort tuning behavior.

Silicon etalon optical filters were fabricated by depositing a pair of silica and silicon coatings of approximately quarter wave optical thickness at 1550 nm on both sides of a silicon wafer. The resulting films provide one-pair Bragg mirrors with approximately 82% reflectivity per side. Because of the thermal isolation design as disclosed herein, such coated silicon wafers could be used as etalon optical filters without further processing, thereby avoiding the need for integrating with complex heating structures. The ability to avoid such further processing would beneficially improve production yield since such thin wafers (e.g., 140 microns thick) are fragile and prone to damage. The optical spectrum of the etalon optical filters was measured using optical collimators and the resulting data was fitted to extract estimated losses and Finesse. Insertion losses of about 0.6 dB loss at peak, a 303 GHz free-spectral range and filter Finesse of about 14.5 were measured.

The silica coated silicon wafers were diced into 300 micron by 500 micron chips to form the etalon optical filters for assembly on a SiOB substrate to form the test optical assembly having a single filter.

Figure 6A:
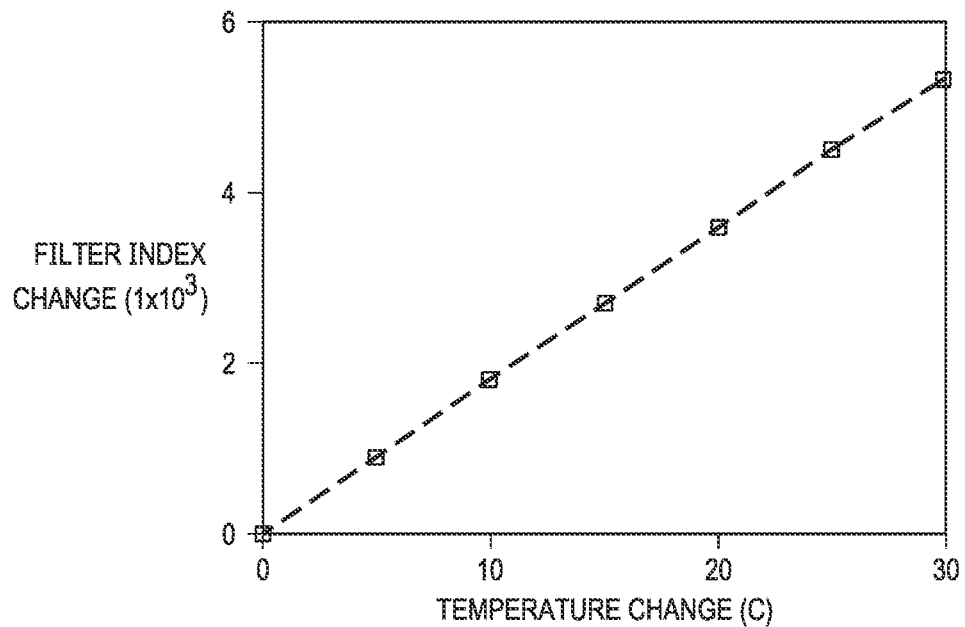
FIGS. 6A and 6B present example plots of (A) measured filter refractive index change due to temperature change (squares; linear fit, dashed line), and, (B), filter optical transmission response to heater electrical power.

Light was coupled from an input optical fiber through the filter and into an output fiber by ball lenses that were actively aligned and then fixed in place with epoxy. The filter was tested by using a thermoelectric cooler (TEC) to increase the temperature of the entire assembly and measure the resulting change in the transmitted optical power. The thermistor used to provide the TEC control loop feedback was embedded in the aluminum base under the sample. The tuning range was small enough that there was a small offset between the recorded temperature of the thermistor and the filter. The optical spectrum as a function of temperature was measured and then, by fitting the shift of the etalon response, the thermo-optic coefficient of the filter material was determined FIG. 6A to have a value 1.80 per ° C. Based on this a temperature change of 29° C. was estimate to provide tuning over one full free spectral range (FSR).

Figure 6B:
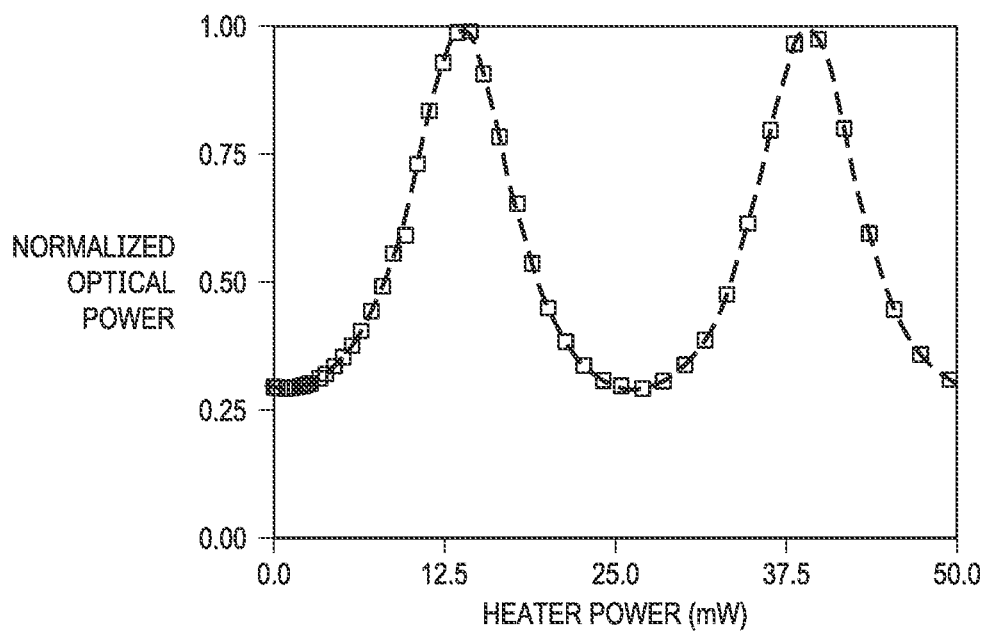

In a further test, the TEC was used to fix the assembly temperature to 25° C. and current was applied to the resistive layer to heat and thereby tune the filter. The applied current and measured voltage across the resistive layer was used to derive the dissipated electrical power and the change in transmitted optical power from a distributed feedback laser source (DFB, 1531 nm) was measured over a range of powers. FIG. 6B shows the measured filter tuning as a function of electrical power (heating power). Tuning over one full FSR was obtained with only 25.3 mW of injected electrical power due to the thermal isolation as disclosed herein.

Further testing was performed on an optical assembly with the apparatus including two etalon optical filters to achieve a wide frequency range of tuning. An assembly such as shown in FIG. 2A-2B was fabricated.

A silicon phase chip (e.g., optical phase shifter chip 220) was located on membrane portions (e.g., membrane portions 120) and between first and second filters (e.g., filters 140*a*, 140*b*) to facilitate providing phase alignment of the composite tuning filter with the overall laser cavity modes and activated by the same thermal tuning mechanism as the filters. The phase chip had antireflection (AR) coatings on both facets to help prevent unwanted frequency ripples. The phase tuner was fabricated from 700 micron thick silicon wafers to simplify handling and so a larger membrane portion was employed below it. The Reflective Semiconductor Optical Amplifier (e.g., RSOA gain chip 240) was mounted directly on SiOB substrate with a portion of the 12 micron silica low thermal conductance layer removed for efficient thermal transfer to the TEC located on the back side of the substrate. A glass partial mirror (e.g., partial mirror 255) chip coated for 80% transmission and 20% back reflection was used to close the optical path of the laser cavity. After the back reflector (partial mirror), outside the laser cavity, a latched garnet optical isolator (e.g., isolator 260) was added before the output optical fiber (e.g., fiber 205) to help prevent parasitic external reflections from entering the laser cavity. Two ball lenses (e.g., lens 250, 252) were used to couple light (e.g., light 210) from the RSOA to the fiber.

The physical path length of the composite laser cavity was about 4 mm which was equivalent to approximately 9.7 mm in free space (neglecting etalon optical filter resonant enhancement). The long optical cavity is thought to be beneficial for linewidth reduction for coherent communication purposes where low phase noise is critical for high-capacity modulation. The assembly size was 11×5 mm, but, since the components were relatively broadly spaced to ensure straightforward assembly for testing purposes, assemblies of reduced sizes can be made.

Figure 7:
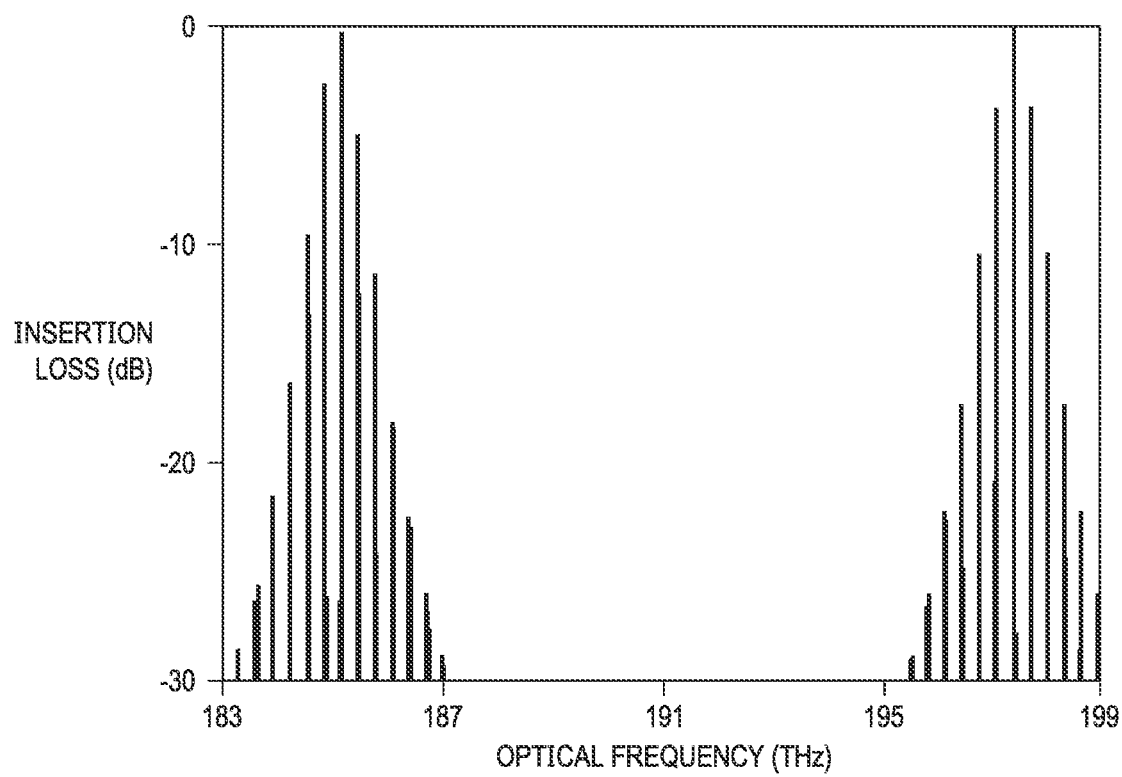
FIG. 7 presents an example simulated composite external cavity filter spectrum showing wide bandwidth feedback selectivity for a test optical assembly such as disclosed in the context of FIGS. 2A-2B.

The FSR values of the two etalon optical filters were selected to yield a wide composite FSR (~100 nm) for C+L band tuning. The etalon optical filters were fabricated from silicon wafers of about 140 microns thickness and two selected portions of the wafer were with appropriate thicknesses to provide the etalon optical filters. The calculated composite cascaded filter spectrum of the vernier pair is shown in FIG. 7 and is based on the measured single Bragg pair mirror Finesse. The total extended free spectral range was 12.6 THz and the excess loss of the filter from the main peak to the next highest peak was 3.3 dB to ensure stable lasing. The cavity mode spacing estimated to be about 6 GHz. The composite frequency filtering response was sufficiently narrow given the filter Finesse to select a single cavity mode for stable lasing.

Further testing including simulating the complete laser geometry to predict the thermal crosstalk between each etalon optical filter and the phase tuner and RSOA as a function of power dissipated in each element. Crosstalk between tuning and optical power controls is generally expected to cause calibration complexity in traditional photonic integrated tunable lasers.

Figure 8A:
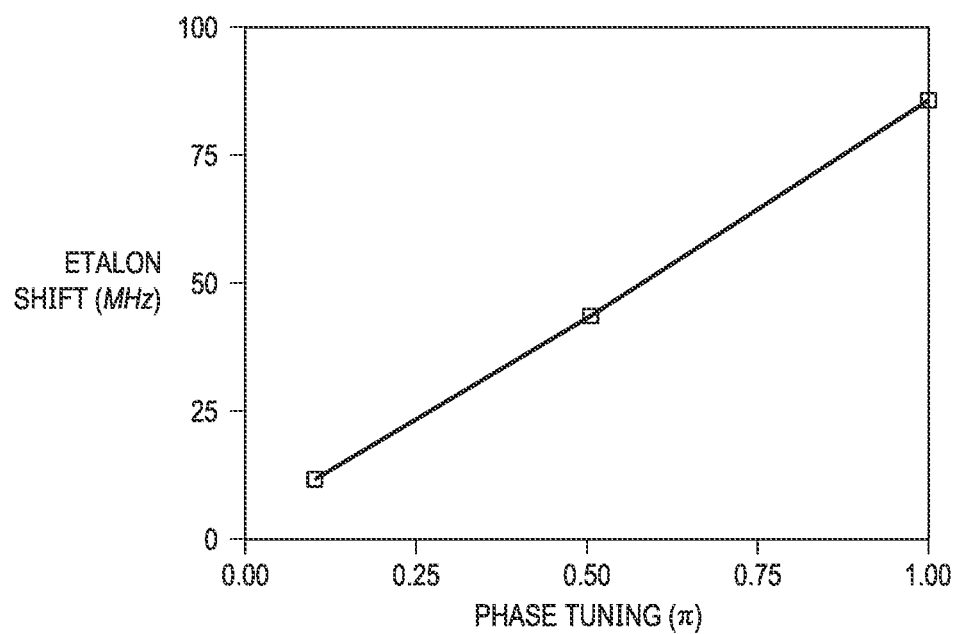
FIGS. 8A and 8B present example plots of simulated thermal crosstalk of phase tuning heater to etalons inducing frequency shift (A) and simulated thermal crosstalk of RSOA bias to etalons (B) indicating minimal disturbance of cavity filter response to gain and phase tuning of laser.
Figure 8B:
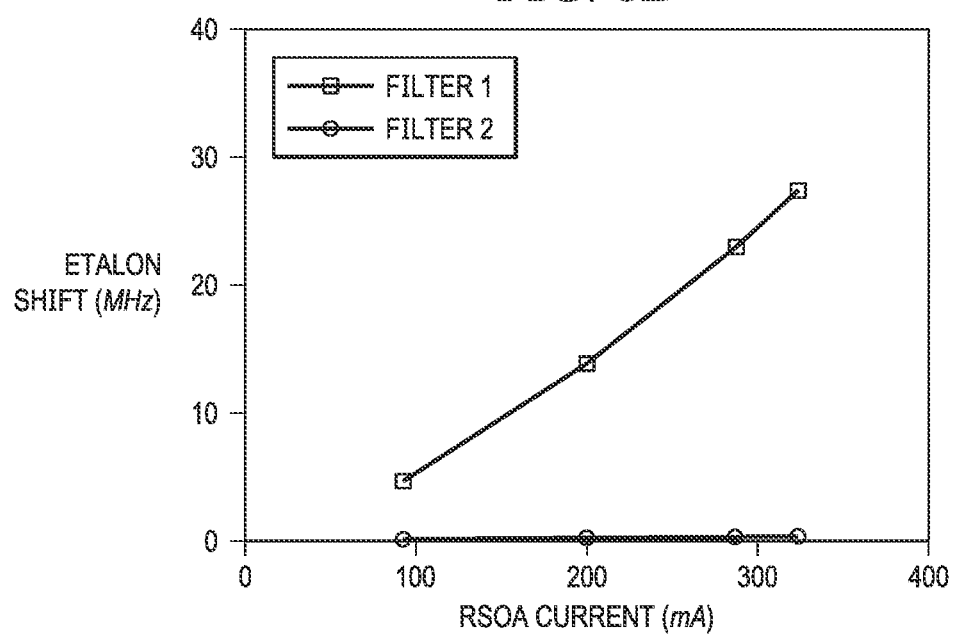

The effect of thermal crosstalk from the phase tuning chip to the filters was simulated. Since the phase must be adjusted after any frequency tuning the crosstalk of the filters to the phase chip was not relevant. The temperature rise in each filter was calculated based on the heater power dissipated under the phase chip. The filter crosstalk terms were essentially symmetric due to the layout of the assembly on the SiOB substrate. The filter temperature rise was converted to a resulting etalon optical filer frequency shift as shown in FIG. 8A. Over the full phase tuning range, negligible filter detuning due to crosstalk of under 100 MHz is expected and the required laser control precision was ±1.5 GHz. The low detuning due to crosstalk is attributed to the high thermal insulation of the membrane portions located under both of the filters as disclosed herein.

To experimentally demonstrate the successful minimization of laser calibration and control crosstalk scanned the tunable laser RSOA bias were scanned from threshold to full output. The RSOA bias power varied by 600 mW across this range.

It is generally expected, for both monolithic and hybrid wafer integrated lasers, there to be substantial thermal and/or electrical crosstalk effect during such tuning. Consequently, it is expected that substantial adjustment of both filter and phase controls will be necessary during optical power adaptation to avoid undesired mode hopping or other shifts from the target frequency.

First, the laser was tuned to 197 THz at 350 mA RSOA bias based on a generated tuning map. This aligned the etalon and cavity modes together at the target frequency. Then the RSOA bias was swept from 80 mA, just above threshold, to 360 mA while adjusting only the phase tuning power at each step to realign the laser cavity mode after the change in carrier density of the RSOA has shifted the effective optical path length. The resistive layer heater power to the optical etalon filters was not adjusted.

Figure 9:
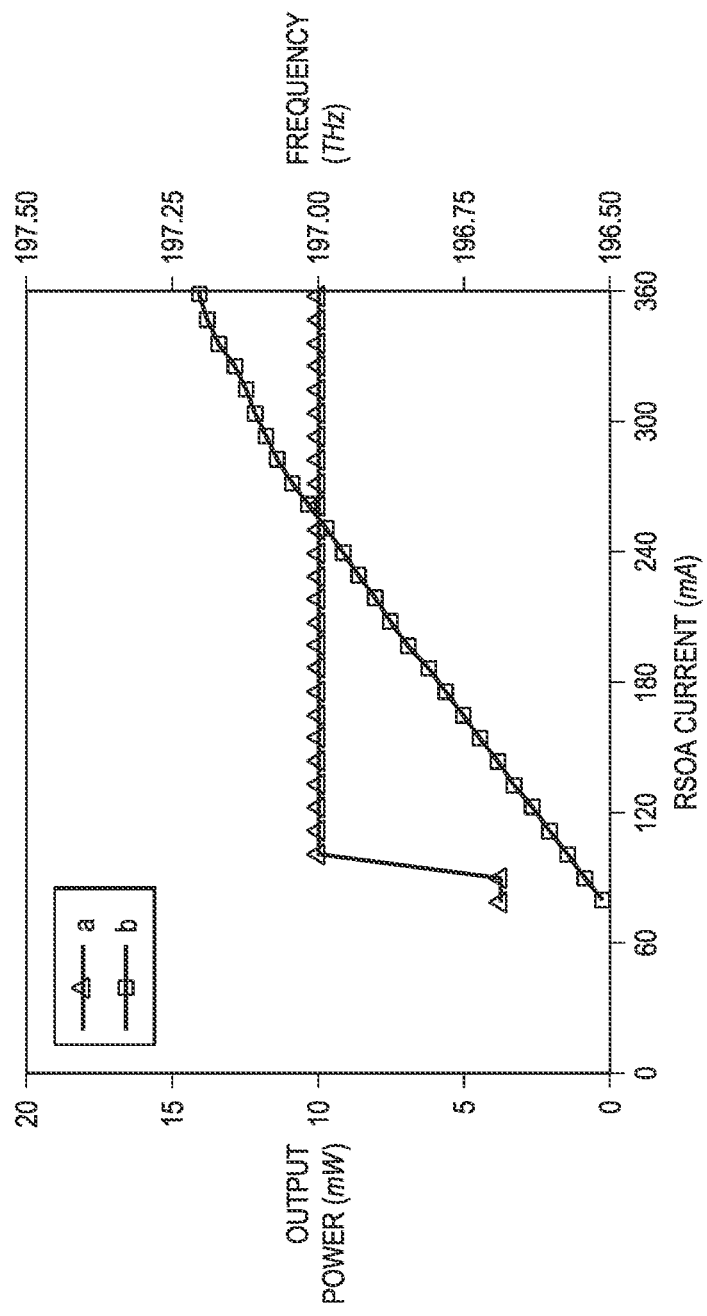
FIG. 9 present example plots of measured thermal crosstalk of change of electrical power dissipation in a reflective semiconductor optical amplifier chip coupled via etalon optical filters to an optical fiber showing induced optical frequency shift (a) and output optical power in fiber (b) indicating minimal disturbance of etalon and cavity filter response to gain tuning of laser.

The resulting laser output power and frequency response, plotted in FIG. 9, shows that over the substantial part of the laser power curve, the lasing frequency was unaffected by the large changes in RSOA bias power. As an example, if the output power adjustment over lifetime to compensate for gain chip aging is 1 dB the RSOA bias would be adjusted by approximately 100 mA. The significant degree of tunable laser calibration and control simplification is attributed to the thermal engineering of the optical design and assembly as disclosed herein.

Although the present disclosure has been described in detail, those skilled in the art should understand that they can make various changes, substitutions and alterations herein without departing from the scope of the invention.

What is claimed is:

1. An optical apparatus, comprising:
   a semiconductor substrate;
   a dielectric layer located on the semiconductor substrate, wherein a membrane portion of the dielectric layer is located over a cavity in a surface of the semiconductor substrate;
   a resistive heater located on the membrane portion, the resistive heater being controllable by a current applied to the resistive heater; and
   an etalon optical filter located on the resistive heater and over the cavity, an optical passband of the etalon optical filter being wavelength tunable by the resistive heater.

2. The optical apparatus of claim 1, wherein the etalon optical filter includes a silicon slab being upright on the dielectric layer.

3. The optical apparatus of claim 1, further including
   another etalon optical filter located on another membrane portion of the dielectric layer over another cavity in the surface of the semiconductor substrate; and
   another resistive heater located below the another etalon filter and on the another portion of the dielectric layer, wherein the another resistive heater is controllable by applying a current thereto; and the another etalon optical filter being wavelength tunable by the another resistive heater.

4. The optical apparatus of claim 1, wherein the dielectric layer is a silica layer and the semiconductor substrate is a silicon substrate.

5. The optical apparatus of claim 4, wherein the semiconductor substrate is a silicon optical bench substrate.

6. The optical apparatus of claim 1, an area footprint of the resistive heater on the membrane portion is within an area footprint of the etalon optical filter on the membrane portion.

7. The optical apparatus of claim 1, wherein the resistive heater is electrically connected to a metal filled via passing through the dielectric layer.

8. The optical apparatus of claim 1, wherein the etalon optical filter is coated with a partially reflective dielectric material layer.

9. The optical apparatus of claim 1, wherein the cavity has an undercut portion with an undercut length below the membrane portion that is a value in a range from 50 to 120 microns, and a maximal cavity depth below the membrane portion that is in a range from 80 to 240 microns.

10. The optical apparatus of claim 1, wherein the apparatus includes a thermally tunable optical filter that is part of a planar optical assembly, the planar optical assembly further including a portion of an optical fiber positioned on the semiconductor substrate to transmit a light of different wavelengths through the etalon optical filter.

11. The optical apparatus of claim 10, wherein the optical fiber is located to transmit the light via the etalon optical filter to a photodetector located on the semiconductor substrate.

12. The optical apparatus of claim 10, wherein the planar optical assembly further includes a tunable optical phase shifter chip physically located on a different resistive heater and located between the etalon optical filter and another etalon optical filter, wherein the phase chip is thermally tunable by applying another current through the different resistive heater.

13. The optical apparatus of claim 10, wherein the planar optical assembly further includes a reflective semiconductor optical amplifier gain chip located on the semiconductor substrate and optically located between the optical fiber and the thermally tuned optical filter.

14. The optical apparatus of claim 10, wherein the planar optical assembly further includes a lens located on the semiconductor substrate and between the photodetector and the thermally tunable optical filter.

15. The optical apparatus of claim 10, wherein the planar optical assembly further includes a lens located on the semiconductor substrate and between the optical fiber and a partial mirror or isolator located on the semiconductor substrate.

16. The optical apparatus of claim 10, wherein the planar optical assembly is a wavelength-tunable optical receiver for a Wavelength Division Multiplexing Passive Optical Network.

17. The optical apparatus of claim 3, further comprising a laser, wherein two of the optical etalon filters are located to filter light in an optical laser cavity of the laser.

18. A method of manufacturing an optical apparatus, comprising:
    forming a thermally tuned optical filter, including:
        providing a semiconductor substrate;
        depositing a dielectric layer on the semiconductor substrate;
        forming a cavity in a surface of the semiconductor substrate wherein a membrane portion of the dielectric layer is located over the cavity in the surface of the semiconductor substrate;
        forming a resistive heater layer on the membrane portion and forming an electrode layer connected to the resistive layer such that a temperature of the resistive layer is controllable by a current applied from the electrode layer to the resistive layer; and
        positioning an etalon optical filter on the resistive layer and over the cavity, wherein an optical passband through the etalon optical filter is tunable by changing a refractive index of the etalon optical filter from the temperature change of the resistive layer.

19. The method of claim 18, wherein the forming of the cavity includes, after forming the resistive layer and after forming the electrode layer, forming one or more openings in the dielectric layer and then etching the semiconductor substrate through the one or more openings.

20. The method of claim 18, wherein the forming of the resistive layer and the forming of the electrode layer includes, after forming the cavity, sputter depositing a nickel-chromium layer on the dielectric layer and then patterning the nickel-chromium layer to form the resistive layer and the electrode layer connected to the resistive layer.

\* \* \* \* \*